(12) United States Patent
Liu et al.

(10) Patent No.: US 9,123,679 B2
(45) Date of Patent: Sep. 1, 2015

(54) ACTIVE MATRIX SUBSTRATE

(75) Inventors: Chuan-Feng Liu, Hsinchu (TW);
Ya-Rou Chen, Hsinchu (TW);
Heng-Hao Chang, Hsinchu (TW)

(73) Assignee: E INK HOLDING INC., Hsinchu (TW)

( * ) Notice: Subject to any disclaimer, the term of this patent is extended or adjusted under 35 U.S.C. 154(b) by 51 days.

(21) Appl. No.: 13/280,487

(22) Filed: Oct. 25, 2011

(65) Prior Publication Data

US 2012/0223443 A1 Sep. 6, 2012

(30) Foreign Application Priority Data

Mar. 3, 2011 (TW) ............................. 100107199 A (51) Int. Cl.
*G02F 1/1343* (2006.01)
*H01L 29/04* (2006.01)
*H01L 27/32* (2006.01)
(Continued)

(52) U.S. Cl.
CPC ........ *H01L 27/3276* (2013.01); *H01L 23/3171* (2013.01); *H01L 24/06* (2013.01); *H01L 23/3192* (2013.01); *H01L 24/05* (2013.01); *H01L 24/16* (2013.01); *H01L 24/32* (2013.01); *H01L 2224/02375* (2013.01); *H01L 2224/0401* (2013.01); *H01L 2224/05548* (2013.01); *H01L 2224/05553* (2013.01); *H01L 2224/05571* (2013.01); *H01L 2224/06133* (2013.01); *H01L 2224/06135* (2013.01); *H01L 2224/16145* (2013.01); *H01L 2224/293* (2013.01); *H01L 2224/2929* (2013.01); *H01L 2224/73204* (2013.01); *H01L 2924/00014* (2013.01); *H01L 2924/381* (2013.01)

(58) Field of Classification Search
USPC ........ 257/72, E33.053, 59; 438/30, 149, 151; 349/138, 43
See application file for complete search history.

(56) References Cited

U.S. PATENT DOCUMENTS 6,330,042 B1 * 12/2001 Kang et al. ...................... 349/43
6,630,686 B1 * 10/2003 Kim ................................ 257/72
6,700,636 B2 * 3/2004 Kim et al. ..................... 349/139
(Continued)

FOREIGN PATENT DOCUMENTS

CN 1491442 A 4/2004
CN 2729758 Y 9/2005

OTHER PUBLICATIONS

China Patent Office, "Office Action", Feb. 26, 2014.
(Continued)

*Primary Examiner* — Bradley K Smith
*Assistant Examiner* — David Goodwin
(74) *Attorney, Agent, or Firm* — WPAT, PC; Justin King (57) ABSTRACT

An active matrix substrate includes a substrate and an insulating unit arranged on the substrate. The substrate includes a display region and a periphery circuit region beside the display region. The periphery circuit region has at least a chip connecting unit. Each chip connecting unit includes a number of connecting elements. Each of the connecting elements includes a conducting pad and a wire electrically connected to the conducting pad. The conducting pads of the connecting elements are arranged in at least two rows. The insulating unit has a number of contact holes corresponding to the conducting pads so that each of the conducting pads is entirely exposed by the corresponding contact hole. The active matrix substrate is applied to a display device to increase reliability of the display device and improve the quality of the display device.

4 Claims, 8 Drawing Sheets

(51) Int. Cl.
*H01L 23/31* (2006.01)
*H01L 23/00* (2006.01)

(56) References Cited

U.S. PATENT DOCUMENTS

| | | | |
|---|---|---|---|
| 6,850,291 B2* | 2/2005 | Song | 349/43 |
| 7,061,015 B2* | 6/2006 | Kim et al. | 257/59 |
| 7,817,235 B2* | 10/2010 | Moon | 349/152 |
| 2004/0099864 A1* | 5/2004 | Kong et al. | 257/72 |
| 2004/0241987 A1 | 12/2004 | Kim et al. | |
| 2007/0171348 A1 | 7/2007 | Moon et al. | |
| 2011/0068346 A1* | 3/2011 | Lee et al. | 257/72 |
| 2012/0229749 A1* | 9/2012 | Nishimura et al. | 349/138 |

OTHER PUBLICATIONS

Taiwan Patent Office, "Office Action", Jun. 24, 2014.

* cited by examiner

ACTIVE MATRIX SUBSTRATE

FIELD OF THE DISCLOSURE

The present disclosure relates to a display device, and more particularly to an active matrix substrate used in a display device.

BACKGROUND OF THE DISCLOSURE

An active matrix substrate is a main element of a display device. The active matrix substrate generally includes a display region and a periphery circuit region beside the display region, and is covered by an insulating layer. The insulating layer is used to protect a variety of electronic components of the active matrix substrate. A number of contact holes are generally defined in the insulating layer on the periphery circuit region to expose a number of conducting pads. The conducting pads are used to electrically connect the electronic components of the active matrix substrate to an external integrated circuit (IC) chip.

Figure 1A:
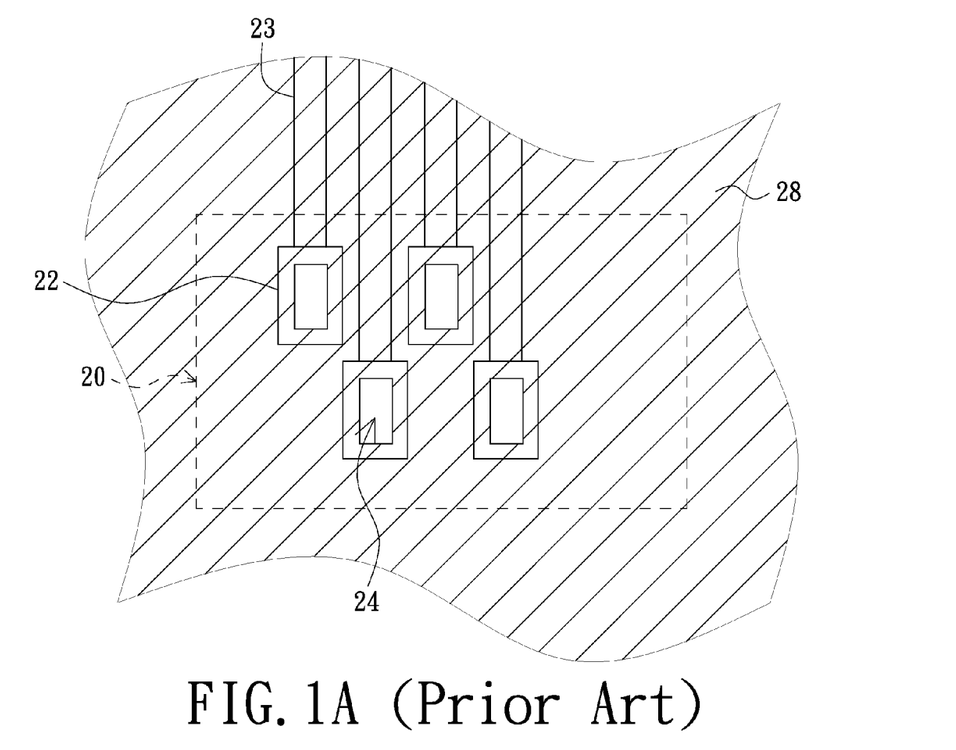
FIG. 1A is a schematic partial and top view of a chip connecting unit of a periphery circuit region of a conventional active matrix substrate.
Figure 1B:
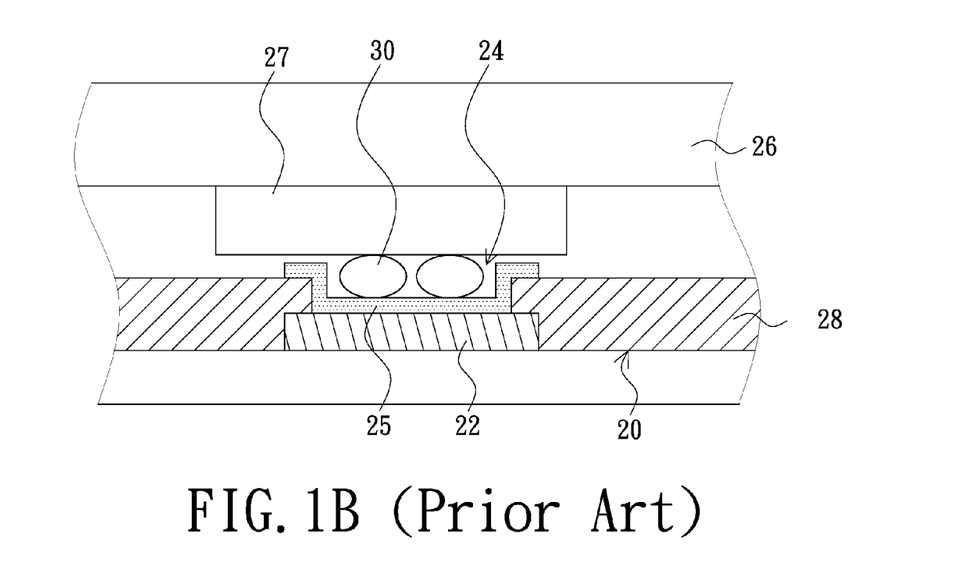
FIG. 1B is a schematic view of the chip connecting unit of FIG. 1A.

FIG. 1A is a schematic partial and top view of a chip connecting unit of a periphery circuit region of a conventional active matrix substrate. FIG. 1B is a schematic view of the chip connecting unit of FIG. 1A, showing a connection between a metal pad of the chip connecting unit and a bump of an IC chip. Referring to FIGS. 1A and 1B, a chip connecting unit 20 of a periphery circuit region of an active matrix substrate includes dozens or hundreds of conducting metal pads 22 (FIG. 1A shows only four metal pads 22). Each metal pad 22 is covered by a transparent conducting pad 25 and connected to a metal wire 23. The large number of the metal pads 22 is arranged in two rows for saving space. In addition, contact holes 24 are defined, and each of the contact holes 24 corresponds to one of the metal pads 22. A dimension of each of the contact holes 24 is less than that of the corresponding metal pad 22. With this configuration, a portion of the metal pad 22 and the transparent conducting layer 25 formed on the metal pad 22 is exposed by the contact hole 24. In a bonding process for connecting an active matrix substrate having the contact hole 24 with an IC chip, conductive particles 30 of an anisotropic conductive adhesive are generally provided to electrically connect the metal pads 22 to bumps 27 of the IC chip 26.

However, in conventional technology, an insulating layer 28 is provided at a region below the IC chip 26 except the bonding regions for the bumps 27. The insulating layer 28 generally contains resin, so the insulating layer 28 tends to expand when absorbing water vapor. This may result in an electrical disconnection between the bumps 27 of the IC chip 26 and the metal pads 22 of the chip connecting unit 20 of the periphery circuit region. Thus, reliability of the display device is easy to be lowered, which may result in display abnormal.

Figure 2A:
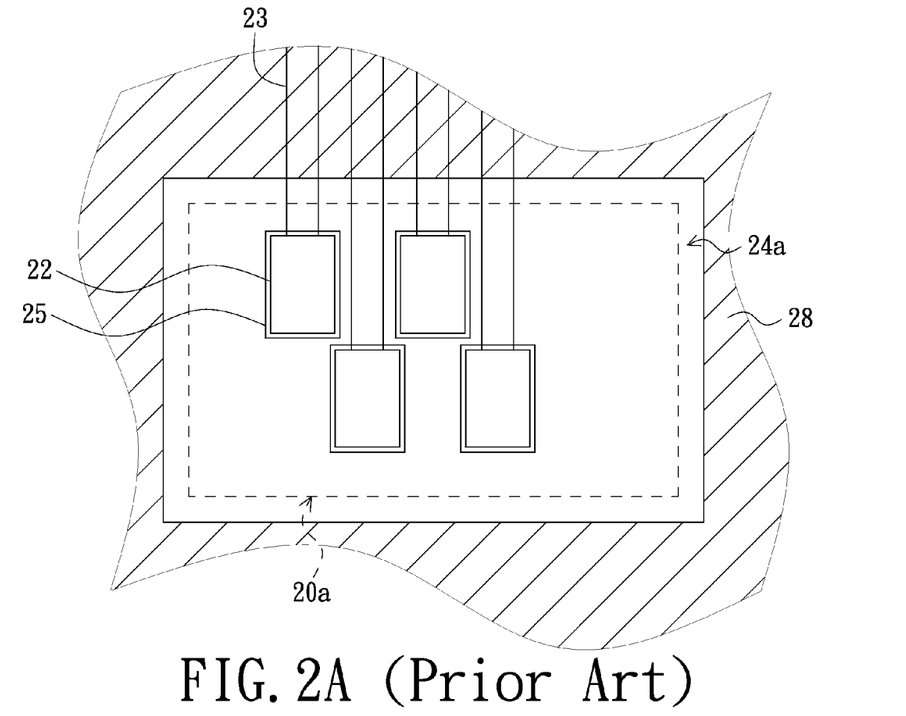
FIG. 2A is a schematic partial and top view of a chip connecting unit of a periphery circuit region of another conventional active matrix substrate.
Figure 2B:
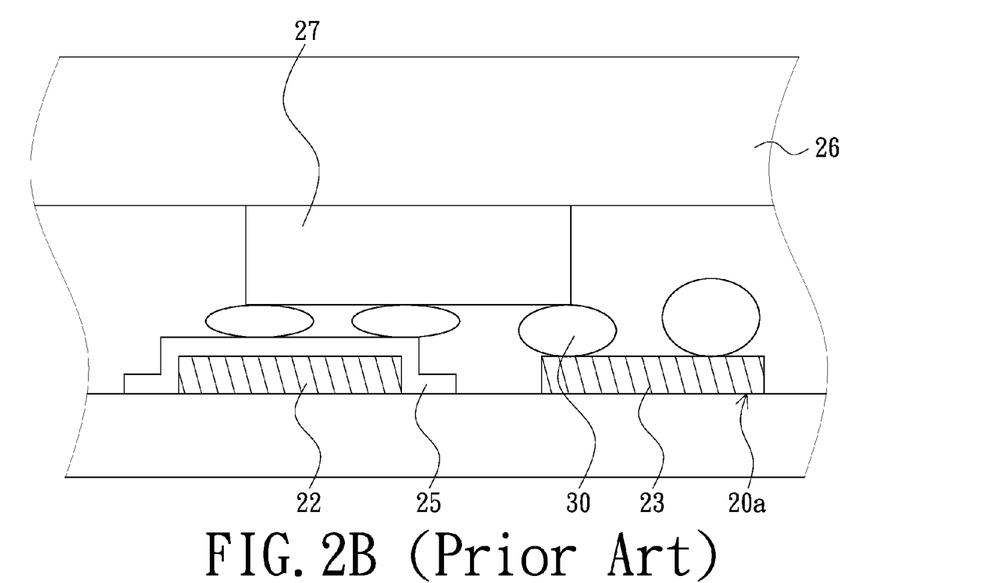
FIG. 2B is a schematic view of the chip connecting unit of FIG. 2A, showing a connection between a metal pad of the chip connecting unit and a bump of an IC chip.

FIG. 2A is a schematic partial and top view of a chip connecting unit of a periphery circuit region of another conventional active matrix substrate. FIG. 2B is a schematic view of the chip connecting unit of FIG. 2A, showing a connection between a metal pad of the chip connecting unit and a bump of an IC chip. Referring to FIGS. 2A and 2B, each chip connecting unit 20a defines only one contact hole 24a. The contact hole 24a is used to expose all the metal pads 22 of the chip connecting unit 20a. In a bonding process for connecting an active matrix substrate having the contact hole 24a with an IC chip, the electrical disconnection caused by expansion of the resin when absorbing water vapor can be avoided. However, as an insulating layer below the bump 27 of the IC chip 26 is entirely omitted, a short circuit may be formed between the metal pad 22 and a metal wire 23 adjacent to the metal pad 22. More specifically, the short circuit is caused by an electrical connection of the bump 27 of the IC chip 26 and the metal wire 23 adjacent to the bump 27 via the conductive particles 30 of the anisotropic conductive adhesive when the IC chip 26 is not accurately aligned in the bonding process. Accordingly, production yield of the display device is reduced.

SUMMARY OF THE DISCLOSURE

The present disclosure provides an active matrix substrate to increase reliability and production yield of a display device.

A first embodiment of the present disclosure provides an active matrix substrate according to achieve the above mentioned advantages and other advantages. The active matrix substrate includes a substrate and an insulating unit arranged on the substrate. The substrate includes a display region and a peripheral circuit region beside the display region. The peripheral circuit region includes at least one chip connecting unit. Each chip connecting unit includes a number of connecting elements. Each connecting element includes a conducting pad and a wire electrically connected to the conducting pad. The conducting pads of the connecting elements are arranged in at least two rows. The insulating unit defines a number of contact holes corresponding to the respective conducting pads, and each of the contact holes is configured for entirely exposing the corresponding conducting pad.

A second embodiment of the present disclosure provides another active matrix substrate according to achieve the above mentioned advantages and other advantages. The active matrix substrate includes a substrate and an insulating unit arranged on the substrate. The substrate includes a display region and a peripheral circuit region beside the display region. The peripheral circuit region includes at least one chip connecting unit. Each chip connecting unit includes a number of connecting elements. Each connecting element includes a conducting pad and a wire electrically connected to the conducting pad. The conducting pads of the connecting elements are arranged in at least two rows. An interval is formed between each two neighboring conducting pads in a same row. In the two neighboring rows, each conducting pad in one of the two rows is aligned to face the corresponding interval of another row. Parts of the wires connected to the conducting pads in the same row pass through the corresponding intervals of another row. The insulating unit defines a contact hole corresponding to the conducting pads, and the contact hole is configured for entirely exposing the conducting pads. The insulating unit covers a portion of each wire in the corresponding interval.

In the active matrix substrate according to the first embodiment, each of the contact holes corresponds to one of the conducting pads, and each of the conducting pads is entirely exposed by the corresponding contact hole. In the active matrix substrate of the second embodiment, all the conducting pads of one chip connecting unit of are exposed by one contact hole, and each of the conducting pads is entirely exposed by the corresponding contact hole. Therefore, there is not any insulating material below the bump of the IC chip. Thus, even if the insulating material of the insulating unit expands when absorbing water vapor, an electrical disconnection between the IC chip and the conducting pads of the active matrix substrate can be avoided, thereby increasing reliability and production yield of the display device. In addition, in the present disclosure, the insulating unit covers a portion of each wire in the corresponding interval. Thus, in a bonding process of the IC chip, a short circuit between the conducting pad of one connecting element and the wire of another connecting element via conducting particles of an anisotropic conductive adhesive can be avoided, thereby increasing the production yield of the display device.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 3:
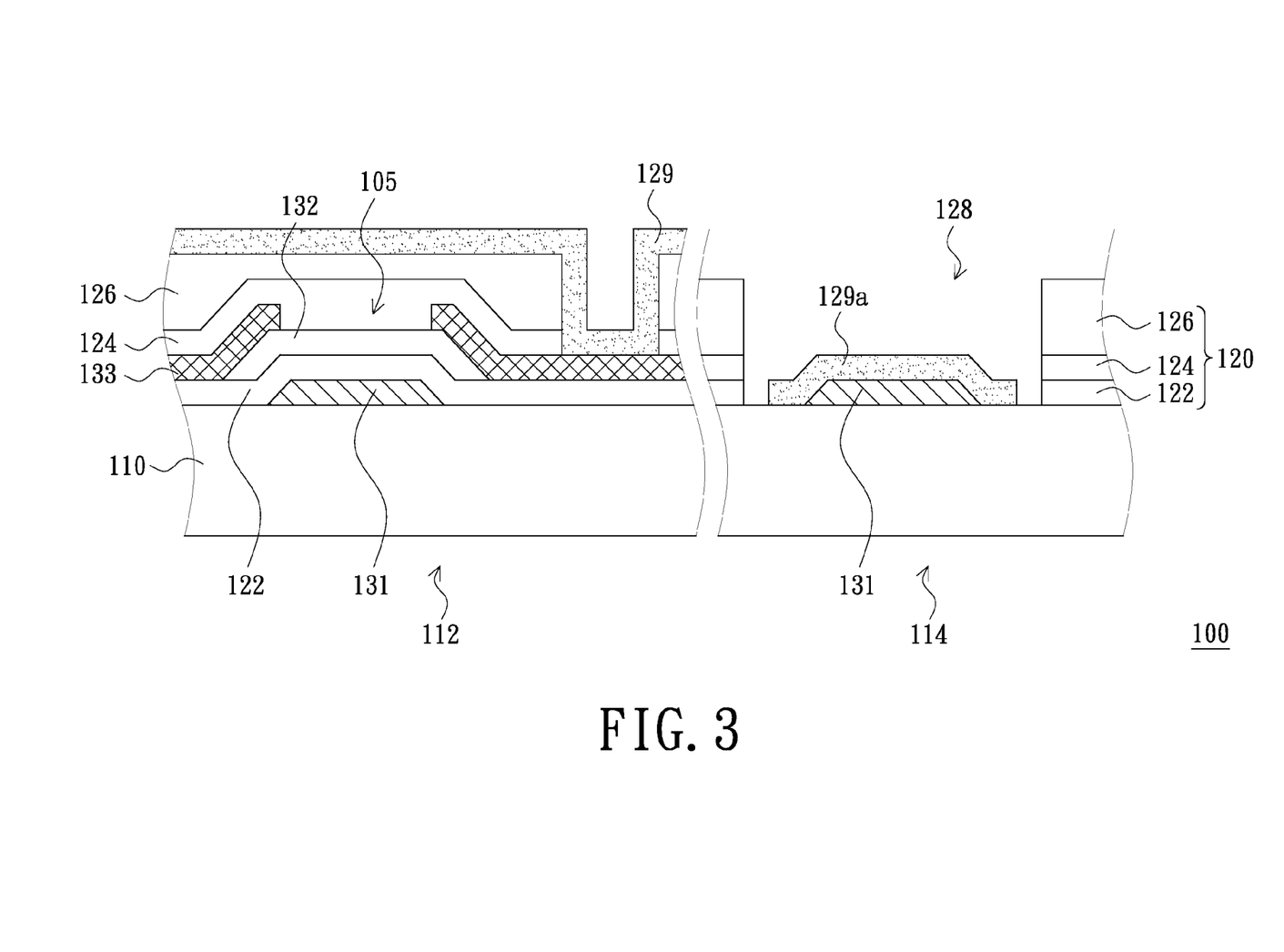
FIG. 3 is a schematic partial and cross-sectional view of an active matrix substrate according to an embodiment of the present disclosure.

FIG. 3 is a schematic partial and cross-sectional view of an active matrix substrate according to an embodiment of the present disclosure. Referring to FIG. 3, the active matrix substrate 100 includes a substrate 110. The substrate 110 includes a display region 112 and a peripheral circuit region 114 beside the display region 112. A number of active devices 105 arranged in an array are formed on the display region 112, and only one active device 105 is shown in FIG. 3. The active devices 105 can be thin film transistors. In this embodiment, in the process of manufacturing the active matrix substrate 100, a first conducting layer 131, an insulating layer 122, a semiconductor layer 132, a second conducting layer 133, a protecting layer 124, a resin layer 126 and a third conducting layer 129 are formed in sequence on the substrate 110, so as to form the active devices 105 and a related circuit. To meet requirement for designing the circuit, the first conducting layer 131 disposed on the peripheral circuit region 114 or the second conducting layer 133 disposed on the peripheral circuit region 114 can include a chip connecting unit for electrically connecting to an external element such as an IC chip.

Figure 4:
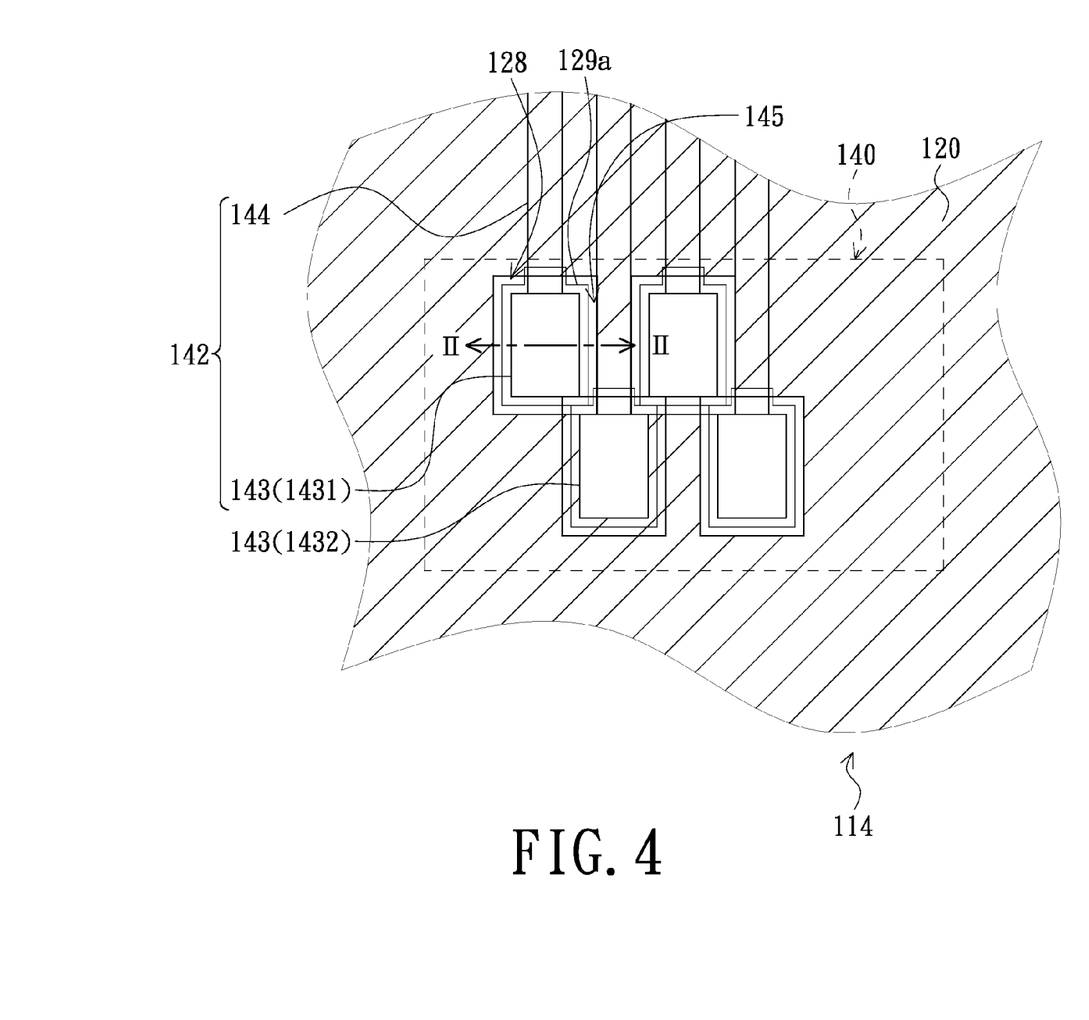
FIG. 4 is a schematic partial and top view of a chip connecting unit of a periphery circuit region of an active matrix substrate according to an embodiment of the present disclosure.
Figure 5:
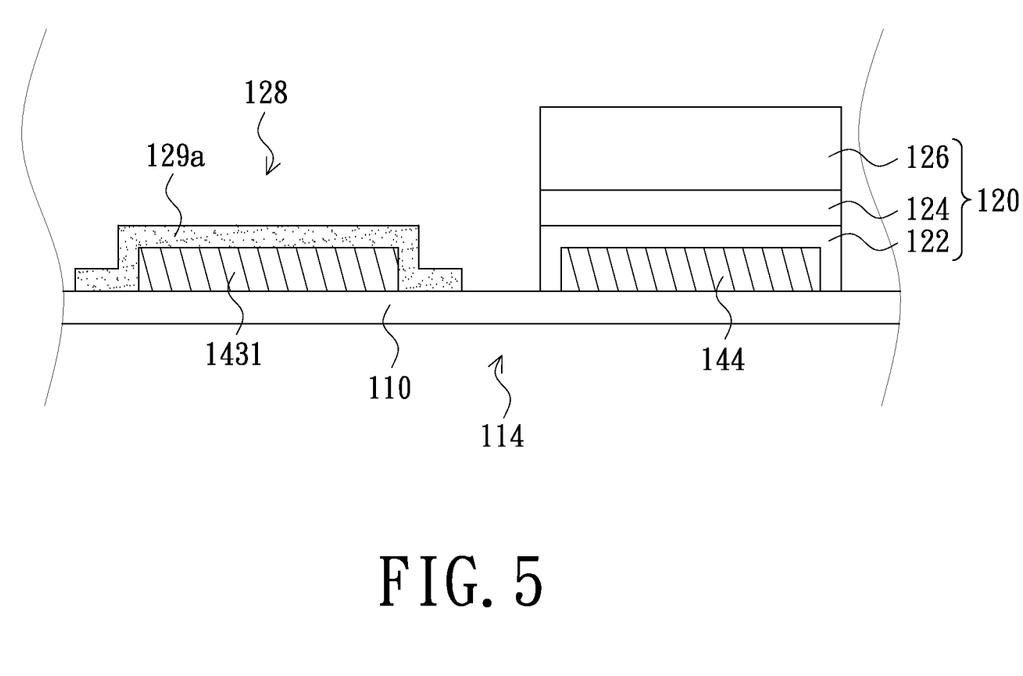
FIG. 5 is a schematic cross-sectional view along a line II-II of FIG. 4.

FIG. 4 is a schematic partial and top view of a chip connecting unit of a periphery circuit region of an active matrix substrate according to an embodiment of the present disclosure. FIG. 5 is a schematic cross-sectional view along a line II-II of FIG. 4. Referring to FIGS. 3 to 5, the peripheral circuit region 114 includes at least one chip connecting unit 140, and only one chip connecting unit 140 is shown in FIG. 4. In this embodiment, a portion of the first conducting layer 131 located at the peripheral circuit region 114 is electrically connected to the external element. More specifically, the first conducting layer 131 includes the chip connecting unit 140. The chip connecting unit 140 includes a number of connecting elements 142. The chip connecting unit 140 may include dozens or hundreds of the connecting elements 142, and only four connecting elements 142 are shown in FIG. 4.

Each connecting element 142 includes a conducting pad 143 and a wire 144 electrically connected to the conducting pad 143. The conducting pads 143 of the connecting elements 142 can be arranged in at least two rows. In this embodiment, the conducting pads 143 of the connecting elements 142 are arranged in a first row and a second row adjacent to the first row. For briefly illustration, a numeral 1431 is used to label the conducting pads 143 arranged in the first row, and a numeral 1432 is used to label the conducting pads 143 arranged in the second row. An interval 145 is formed between each two neighboring conducting pads 1431 in the first row. Similarly, an interval 145 is formed between each two neighboring conducting pads 1432 in the second row. Each conducting pad 1432 in the second row is spatially relation to the corresponding interval 145 of the first row. For example, the conducting pad 1432 in the second row can be aligned to face the corresponding interval 145 of the first row. The wires 144 connected to the conducting pads 1432 of the second row pass through the corresponding intervals 145 between the conducting pads 1431 in the first row. It should be noted, the connecting elements 142 are not limited to be arranged in two rows. In an alternative embodiment, the connecting elements 142 can be arranged in a number of rows, and in each two neighboring rows, the conducting pads 143 arranged in a same row can be aligned to the corresponding intervals 145 of another row, and the wires 144 connected to the conducting pads 143 of the same row pass through the corresponding intervals 145 between the conducting pads 143 of another row.

The insulating unit 120 includes the insulating layer 122, the protecting layer 124 and the resin layer 126. The insulating unit 120 defines a number of contact holes 128 corresponding to the respective conducting pads 143. Each of the contact holes 128 is configured for entirely exposing the corresponding conducting pad 143. In this embodiment, each of the insulating layer 122, the protecting layer 124 and the resin layer 126 defines a number of openings corresponding to the conducting pads 143 respectively. The contact holes 128 of the insulating unit 120 are comprised of the openings. In this embodiment, an orthographic projection area of each contact hole 128 projecting on the substrate 110 is larger than an orthographic projection area of the corresponding conducting pad 143 projecting on the substrate 110. With this configuration, the conducting pad 143 can be entirely exposed by the corresponding contact hole 128. A portion of the insulating unit 120 may cover a portion of each interval 145 between each two conducting pads 1431 of the first row, so as to cover a portion of each wire 144 in the corresponding interval 145 of the first row. In another embodiment, when the two connecting elements 142 are relatively adjacent to each other, or a diameter of the contact hole 128 is relatively great, each two adjacent contact holes 128, which are respectively corresponded to the conducting pad 1431 in the first row and the conducting pad 1432 in the second row, may communicate with each other.

In addition, in this embodiment, the first conducting layer 131 may be a metal layer (such as a metal layer without anti-oxidation function), so the third conducting layer 129 formed on the resin layer 126 can be filled in the contact holes 128 to cover the corresponding conducting pads 143, so as to protect the conducting pads 143. The third conducting layer 129 can be, but not limited to, an anti-oxidation metal layer or a transparent conducting layer such as an indium tin oxide (ITO) layer or an indium zinc oxide (IZO) layer. In this embodiment, the third conducting layer 129 has a number of protecting patterns 129a corresponding to the respective conducting pads 143. Each protecting pattern 129a covers the corresponding conducting pad 143 through the corresponding contact hole 128. In an alternative embodiment, the first conducting layer 131 can be an anti-oxidation metal layer, and the third conducting layer 129 may not include the protecting patterns 129a which are used for covering the conducting pads 143.

Figure 6:
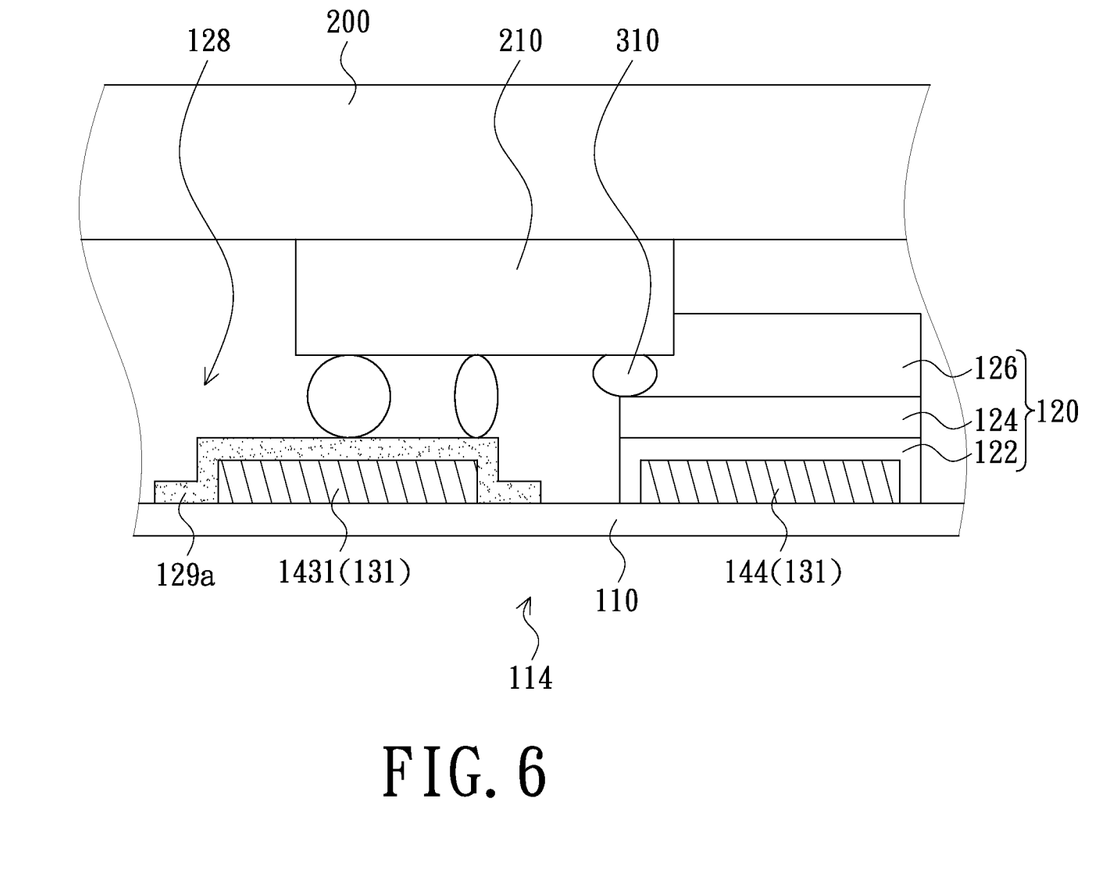
FIG. 6 is a schematic view showing a connection of a connecting pad of a periphery circuit region of an active matrix substrate and a bump of an IC chip according to an embodiment of the present disclosure.

FIG. 6 is a schematic view showing a connection of a connecting pad of a periphery circuit region of an active matrix substrate and a bump of an IC chip according to an embodiment of the present disclosure. Referring to FIGS. 4 and 6, when an IC chip 200 is connected to the peripheral circuit region 114 of the active matrix substrate, each bump 210 of the IC chip 200 can be electrically connected to the corresponding conducting pad 143 of the chip connecting unit 140 of the periphery circuit region 114 through conductive particles 310 of an anisotropic conductive adhesive. In the embodiment, some of the conductive particles may be disposed in the resin layer 126. Because the contact hole 128 expose the conducting pad 143 entirely, when the IC chip 200 is precisely connected to the periphery circuit region 114, there is not insulating material right below each bump 210 of the IC chip 200. With this configuration, an electrical disconnection between the IC chip 200 and the conducting pad 143 of the active matrix substrate can be avoided even if the insulating material of the insulating unit 120 expands when absorbing water vapor. Thus, reliability of the display device can be increased. In addition, as each wire 144 located in the corresponding interval 145 between the conducting pads 1431 in the first row is covered by the insulating unit 120, the bump 210 and the wire 144 located in the interval 145 would not be electrically connected to each other even if the IC chip 200 is not properly located at a predetermined position. Therefore, a shot circuit can be avoided and production yield of the display device can be increased.

Figure 7:
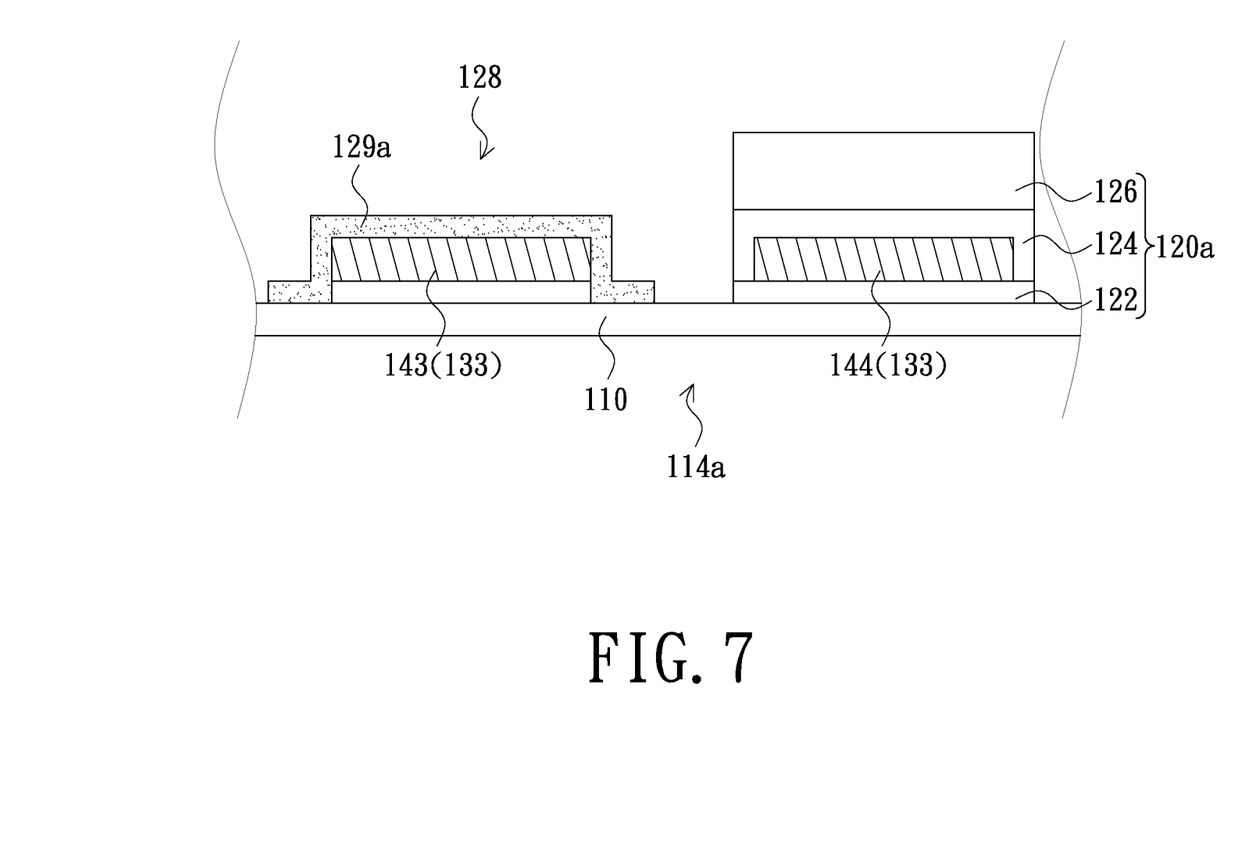
FIG. 7 is a schematic partial and cross-sectional view of a periphery circuit region of an active matrix substrate according to another embodiment of the present disclosure.

FIG. 7 is a schematic partial and cross-sectional view of a periphery circuit region of an active matrix substrate according to another embodiment of the present disclosure. Referring to FIG. 4 and FIG. 7, the periphery circuit region of the active matrix substrate of this embodiment is similar to that of FIG. 4. The difference between the active matrix substrate in this embodiment and the above active matrix substrate 100 is that the second conducting layer 133 of the peripheral circuit region 114a of this embodiment is capable of being electrically connected to the external component. That is, the second conducting layer 133 of this embodiment includes a chip connecting unit 140, and the insulating layer 122 of the insulating unit 120a is formed between the second conducting layer 133 and the substrate 110. The protecting layer 124 and the resin layer 126 of the insulating unit 120a are formed on the second conducting layer 133. The protecting layer 124 and the resin layer 126 each define a number of openings corresponding to the conducting pads 143 respectively. The contact holes 128 are comprised of the openings of the protecting layer 124 and the openings of the resin layer 126.

In this embodiment, the second conducting layer 133 can be a metal layer (such as a metal layer without anti-oxidation function). Thus, the third conducting layer 129 formed on the resin layer 126 can be filled in the contact holes 128 to protect the conducting pads 143. In this embodiment, the third conducting layer 129 has a number of protecting patterns 129a corresponding to the conducting pads 143, and each protecting pattern 129a covers the corresponding conducting pad 143 through the corresponding contact hole 128. In another embodiment, the second conducting layer 133 can be an anti-oxidation metal layer, and the third conducting layer 129 is not necessary to include the protecting patterns 129a which are used to cover the conducting pads 143.

The active matrix substrate in this embodiment and the active matrix substrate 100 disclosed above achieve similar advantages. Thus, the advantages of the active matrix substrate in this embodiment are not further disclosed.

Figure 8:
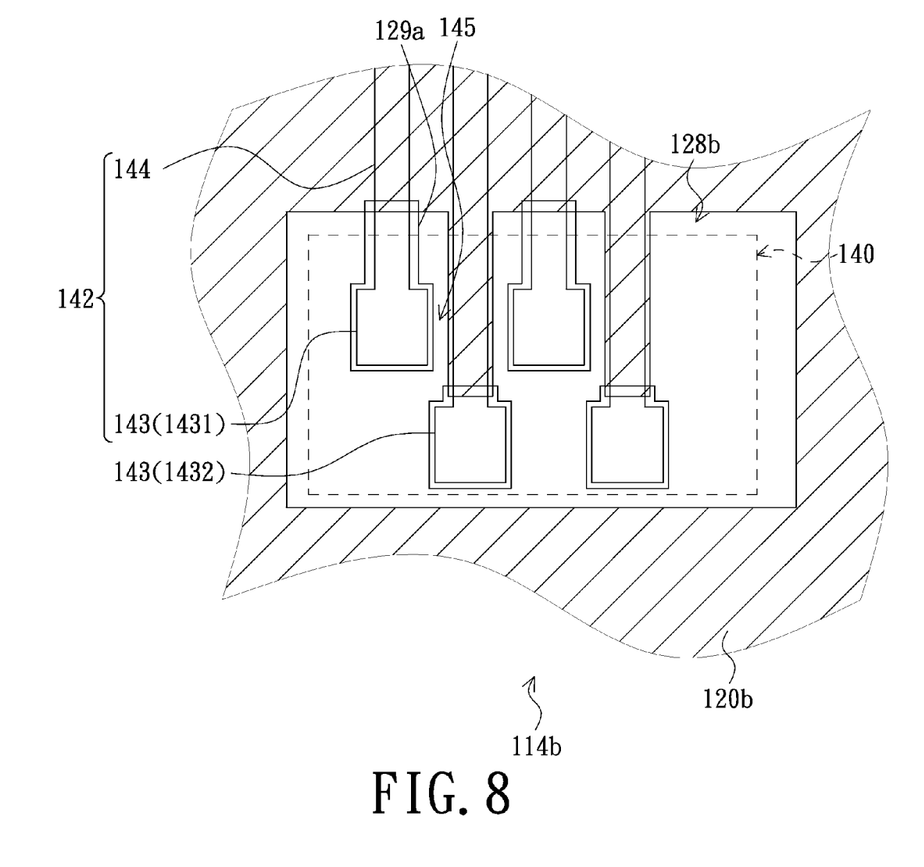
FIG. 8 is a schematic top view of a chip connecting unit of a periphery circuit region of an active matrix substrate according to another embodiment of the present disclosure.

FIG. 8 is a schematic top view of a chip connecting unit of a periphery circuit region of an active matrix substrate according to another embodiment of the present disclosure. Referring to FIG. 8, the active matrix substrate in this embodiment is similar to the active matrix substrate 100. The active matrix substrate in this embodiment differs from the active matrix substrate 100 by the periphery circuit region. More specifically, in this embodiment, the insulating unit 120b of a periphery circuit region 114b corresponding to the conducting pads 143 defines only one contact hole 128b. The contact hole 128b corresponds to all the conducting pads and is configured for entirely exposing all the corresponding conducting pads 143. In addition, the insulating unit 120b covers the respective intervals 145 between the conducting pads 1431 in the first row, and also covers the wires 144 located in the intervals 145 between the conducting pads 1431 in the first row and connected to the conducting pads 1432 in the second row. In this embodiment, a portion of the insulating unit 120b corresponding to the chip connecting unit 140 is formed in a fork shape for covering a portion of each wire 144 in the corresponding interval 145.

In this embodiment, when the IC chip is bonded with the active matrix substrate, due to the wires 144 located in the intervals 145 between the conducting pads 1431 in the first row being covered by the insulating unit 120a, a shot circuit between the conducting pad 1431 in the first row and the wire 144 connecting to the conducting pad 1432 in the second row through the conducting particles of the anisotropic conductive adhesive is avoided even if the IC chip is not properly located at a predetermined position. Therefore, the production yield of the display device can be increased. In addition, as each of the conducting pads 143 is entirely exposed, an electrical disconnection between the IC chip and the conducting pads 143 of the active matrix substrate can be avoided even if the insulating material of the insulating unit 120b expands when absorbing water vapor. Thus, the reliability of the display device is increased.

It should be noted, although the chip connecting unit 140 is formed in the first conducting layer, in another embodiment, the chip connecting unit 140 can also be formed in the second conducting layer.

In summary, the active matrix substrate in the present disclosure has at least one of the advantages as disclosed below.

Firstly, as each of the conducting pads is entirely exposed by the corresponding contact hole, there is not any insulating material right below the bump of the IC chip. Thus, the electrical disconnection between the IC chip and the conducting pads of the active matrix substrate can be avoided even if the insulating material of the insulating unit expands when absorbing water vapor, and the reliability and the production yield of the display device can be increased.

Secondly, as the insulating unit covers a portion of each wire in the corresponding interval, the short circuit formed between the conducting pads and the wires adjacent to the conducting pads can be avoided after the bonding process of the IC chip. Thus, the production yield of the display device can be further increased.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An active matrix substrate comprising:
   a substrate comprising a display region and a peripheral circuit region beside the display region, the peripheral circuit region comprising at least one chip connecting unit, each chip connecting unit comprising a plurality of connecting elements, each connecting element comprising a conducting pad and a wire electrically connected to the conducting pad, and the conducting pads of the same chip connecting unit being arranged in at least two parallel rows wherein the conducting pads are used to bear an external IC chip; and
   an insulating unit arranged on the substrate, the insulating unit defining a plurality of contact holes corresponding to the respective conducting pads, and each of the contact holes being configured for entirely exposing the corresponding conducting pad wherein a first contact hole and a second contact hole are arranged adjacently in a first row separated by a portion of said insulating unit and are connected to a third contact hole located between said first contact hole and said second contact hole in a second row;
   wherein an interval is formed between each two neighboring conducting pads in the same row, each conducting pad arranged in a first row is aligned to face the corresponding interval of the conducting pads arranged in a second row, and parts of the wires connected to the conducting pads arranged in the first row pass through the corresponding intervals of the conducting pads arranged in the second row with each wire located in the corresponding interval between the conducting pads arranged in the second row is covered by the insulating unit,
   wherein a first conducting layer, an insulating layer, a second conducting layer, a protecting layer and a resin layer are formed in sequence on the substrate, the second conducting layer comprises the chip connecting unit, the insulating unit comprises the insulating layer, the protecting layer and the resin layer, each of the protecting layer and the resin layer defines a plurality of openings corresponding to the conducting pads respectively, and the contact holes of the insulating unit are comprised of the openings.

2. The active matrix substrate according to claim 1, wherein an orthographic projection area of each contact hole projecting on the substrate is larger than an orthographic projection area of the corresponding conducting pad projecting on the substrate.

3. The active matrix substrate according to claim 1, wherein the second conducting layer is a metal layer, a third conducting layer is further formed on the resin layer, the third conducting layer has a plurality of protecting patterns corresponding to the respective conducting pads, and the protecting patterns cover the corresponding conducting pads through the contact holes.

4. The active matrix substrate according to claim 1, wherein the second conducting layer is a metal layer.

* * * * *